(12) United States Patent
Mieno

(10) Patent No.: US 8,835,213 B2
(45) Date of Patent: Sep. 16, 2014

(54) SEMICONDUCTOR DEVICE AND MANUFACTURING METHOD THEREOF

(75) Inventor: Fumitake Mieno, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 192 days.

(21) Appl. No.: 13/401,819

(22) Filed: Feb. 21, 2012

(65) Prior Publication Data

US 2013/0105918 A1    May 2, 2013

(30) Foreign Application Priority Data

Nov. 2, 2011  (CN) .......................... 2011 1 0340752

(51) Int. Cl.
*H01L 21/335* (2006.01)
*H01L 21/02* (2006.01)
*H01L 21/28* (2006.01)
*H01L 29/51* (2006.01)
*H01L 29/66* (2006.01)
*H01L 29/49* (2006.01)
*H01L 21/3105* (2006.01)

(52) U.S. Cl.
CPC .... *H01L 21/28194* (2013.01); *H01L 21/02181* (2013.01); *H01L 29/518* (2013.01); *H01L 29/66553* (2013.01); *H01L 21/02282* (2013.01); *H01L 29/4983* (2013.01); *H01L 21/02307* (2013.01); *H01L 29/66545* (2013.01); *H01L 21/0228* (2013.01); *H01L 21/3105* (2013.01); *H01L 21/02123* (2013.01)
USPC ...................... 438/99; 438/591; 257/E21.411

(58) Field of Classification Search
CPC ........... H01L 51/0533; H01L 51/0071; H01L 21/306
USPC .............................. 438/99, 591; 257/E21.411
See application file for complete search history.

(56) References Cited

U.S. PATENT DOCUMENTS 7,670,894 B2 *   3/2010   Rachmady et al. ........... 438/216

* cited by examiner

*Primary Examiner* — Minchul Yang
(74) *Attorney, Agent, or Firm* — Innovation Counsel LLP

(57) ABSTRACT

A semiconductor device includes a substrate having an active region, a gate structure on the active region, and spacers formed on opposite sides of the gate structure. The gate structure includes a gate dielectric layer on the active region, a metal gate on the gate dielectric layer, and sidewalls on both side surfaces of the gate structure. Each of the sidewalls is interposed between the metal gate and one of the spacers. The sidewalls include a self-assembly material. The gate dielectric layer includes a high-K material. The spacers include silicon nitride. The gate structure also includes a buffer layer interposed between the metal gate and the gate dielectric layer.

17 Claims, 5 Drawing Sheets

SEMICONDUCTOR DEVICE AND MANUFACTURING METHOD THEREOF

CROSS-REFERENCE TO RELATED APPLICATIONS

This application claims priority to Chinese Patent Application No. 201110340752.9, filed on Nov. 2, 2011 and entitled "Semiconductor Device and Manufacturing Method Thereof", which is incorporated herein by reference in its entirety.

BACKGROUND OF THE INVENTION

1. Field of the Invention

The present invention relates to the field of semiconductor manufacturing technologies, and more particularly to a semiconductor device and manufacturing method thereof.

2. Description of the Related Art

With the continuous development of semiconductor manufacturing techniques, critical dimension of semiconductor devices continue to shrink. As well known by those skilled in the art, gate-last and gate-first approaches are available for manufacturing field effect transistors. In addition, high dielectric constant (also termed as high-K) materials have been more and more applied in semiconductor manufacturing techniques to further reduce device dimensions. Materials having a dielectric constant greater than that of silicon dioxide can be considered high-K materials.

One issue accompanied with the application of high-K materials is an increase in parasitic capacitance, particularly in those situations where side walls are formed using high-K materials.

A method of selectively depositing a high-K dielectric film is disclosed in U.S. Pat. No. 7,670,894, as illustratively shown in FIG. 1 thereof. According to the disclosure of this patent, a resist 101 is treated to obtain a surface with —O—CH$_3$ groups; then a hafnium oxide layer 103 is selectively deposited through atomic layer deposition (ALD) using HfCl$_4$ and water vapor (H$_2$O) as precursors.

However, in this patent, the parasitic capacitance may be increased due to the presence of the sidewalls formed of a high-k material. On the other hand, when covering sidewalls thus formed with a metal, a coverage issue may occur even with ALD. For example, voids may occur in the deposited metal 201, causing short circuits, as shown in FIG. 2, and yield is consequently lowered. The shape of sidewalls is important for the deposition of metal gate material, and therefore, the technique disclosed in this patent needs very sophisticated manufacturing processes.

Thus, there is a need to alleviate or address the above issues. In view of this, a novel and inventive semiconductor device and manufacturing method thereof are proposed for alleviating or eliminating one or more problems in the prior art.

BRIEF SUMMARY OF THE INVENTION

An embodiment of the present invention is to alleviate or eliminate one or more problems in the prior art.

Another embodiment of the present invention is to reduce the K value (i.e., dielectric constant) of a dielectric material for forming the sidewalls in a semiconductor device, the dielectric material may also be used for forming a gate dielectric layer.

A further embodiment of the present invention is to eliminate sidewalls formed of high-K dielectric so as to reduce parasitic capacitance.

Another embodiment of the present invention is to improve metal film coverage in a semiconductor device to which a high-K dielectric material is applied and manufacturing process thereof (particularly, for a gate-last process).

An embodiment of the present invention provides a semiconductor device that includes a substrate having an active region, a gate structure on the active region, and spacers formed at opposite sides of the gate structure. The gate structure includes a gate dielectric layer on the active region, a metal gate on the gate dielectric layer, and sidewalls on both side surfaces of the gate structure. Each of the sidewalls is interposed between the metal gate and one of the spacers. The sidewalls are formed of a self-assembly material.

In one embodiment, the gate dielectric layer may include a high-K dielectric material. In one embodiment, the high-K dielectric is hafnium oxide.

In one embodiment, the self-assembly material comprises CH$_3$(CH$_2$)xCH$_2$SiCl$_3$, where x is an integer in a range from 6 to 10. In one embodiment, x is 8.

In one embodiment, the semiconductor device further comprises a conductive buffer layer that is interposed between the gate dielectric layer and the metal gate, and the conductive buffer layer is disposed between the sidewalls.

In one embodiment, the buffer layer includes one of titanium nitride, tantalum, tantalum nitride, alloy of tantalum nitride and aluminum nitride, or alloy of titanium nitride and aluminum nitride.

In one embodiment, the spacers may include silicon nitride.

In one embodiment, the semiconductor device further comprises an interlayer dielectric layer located on the substrate, the gate structure being formed in the interlayer dielectric layer.

In one embodiment, an upper surface of the interlayer dielectric layer is substantially flush with an upper surface of the metal gate.

Another embodiment of the present invention provides a method of manufacturing a semiconductor device. The method includes following steps: (a) providing a substrate having an active region, wherein the substrate includes an interlayer dielectric layer having an opening formed thereon to expose a portion of the surface of the active region. Spacers are formed on the side surfaces of the opening, and a first dielectric layer is formed on a surface of the active region between the spacers; (b) forming a self-assembly material layer on at least a surface of the spacers and on a surface of the first dielectric layer; (c) removing a portion of the self-assembly material layer formed on the surface of the first dielectric layer while maintaining portions of the self-assembly material layer that are on the surfaces of the spacers, and removing the first dielectric layer to expose a surface of the active region; and (d) selectively forming a second dielectric layer on the exposed surface of the active region.

In one embodiment, the method further comprises: (e) before forming the self-assembly material layer, pre-treating a surface of the interlayer dielectric, the surfaces of the spacers, and a surface of the first dielectric layer to form dangling bonds on those surfaces.

In one embodiment, the pre-treating is conducted with the use of a H$_2$SO$_4$/H$_2$O$_2$ or SC-2 solution so that the surfaces are formed with —OH termination.

In one embodiment, the portion of the self-assembly material layer is a mono-layer of the self-assembly material.

In one embodiment, the portion of the self-assembly material and the first dielectric layer are removed with use of diluted hydrofluoric acid.

In one embodiment, the second dielectric layer is formed of a high-K dielectric material.

In one embodiment, the high-K dielectric material is hafnium oxide.

In one embodiment, the hafnium oxide is prepared using HfCl$_4$ and water vapor as precursors.

In one embodiment, the hafnium oxide is prepared using Hf(Obu)$_4$ and O$_2$ as precursors.

In one embodiment, the self-assembly material is CH$_3$(CH$_2$)xCH$_2$SiCl$_3$, where x is an integer in a range from 6 to 10. In one preferred embodiment, x is 8.

In one embodiment, the method further comprises: (f) selectively forming a conductive buffer layer on the second dielectric layer using the self-assembly material layer as a mask.

In one embodiment, the buffer layer includes one of titanium nitride (TiN), tantalum (Ta), tantalum nitride (TaN), alloy of tantalum nitride and aluminum nitride (TaAlN), and alloy of titanium nitride and aluminum nitride (TiAlN).

In one embodiment, the buffer layer is formed through Enhanced Atomic Layer Deposition using a titanium-contained precursor and a nitrogen-contained precursor which are plasma-cracked, and during the formation of the buffer layer, the titanium-contained precursor is introduced first.

In one embodiment, the method further comprises: (g) forming a metal gate on the buffer layer.

In one embodiment, the interlayer dielectric layer has an upper surface that is substantially flush (coplanar) with an upper surface of the metal gate.

In one embodiment, the method further comprises: (h) annealing after forming the self-assembly material layer.

Although the present invention is particularly useful in advanced semiconductor device manufacturing techniques (e.g., for memory devices, logic devices), the present invention is not limited thereto. In practice, the present invention has a wide range of applications.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention. The present invention can be more clearly understood by reading the following detailed description with reference to the accompanying drawings, in which.

Figure 1:
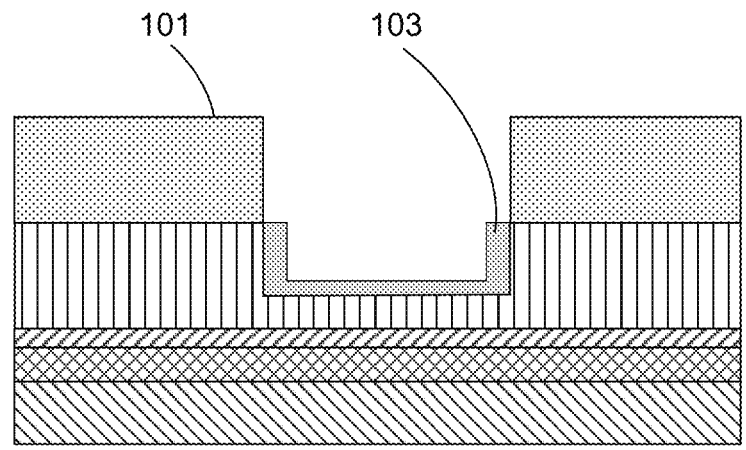
FIG. 1 is a schematic view showing the steps of forming a high-K dielectric layer in the prior art.
Figure 2:
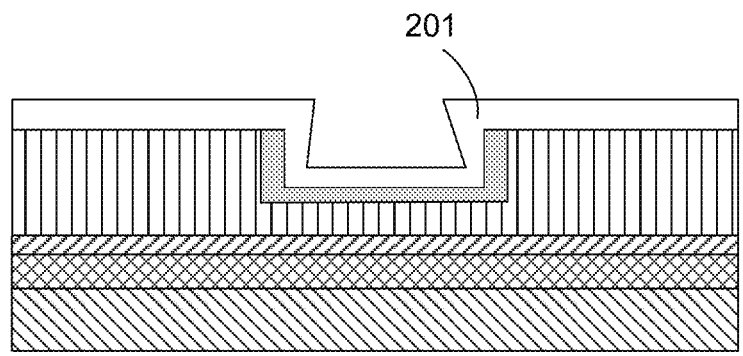
FIG. 2 is a schematic view showing one of the problems existed in the prior art.

It should be understood that these drawings are merely illustrative in nature and are not intended to limit the scope of the present invention. In the drawings, various components are not shown strictly in scale or according to their actual shapes, wherein, some of the components (such as, layers or parts) may be enlarged relative to others so as to more clearly explain the principles of the present invention. Moreover, details that may obscure the gist of the present invention are not shown in the drawings.

DETAILED DESCRIPTION OF THE INVENTION

Hereunder, embodiments of the present invention will be described in conjunction with the accompanying drawings.

Figure 3:
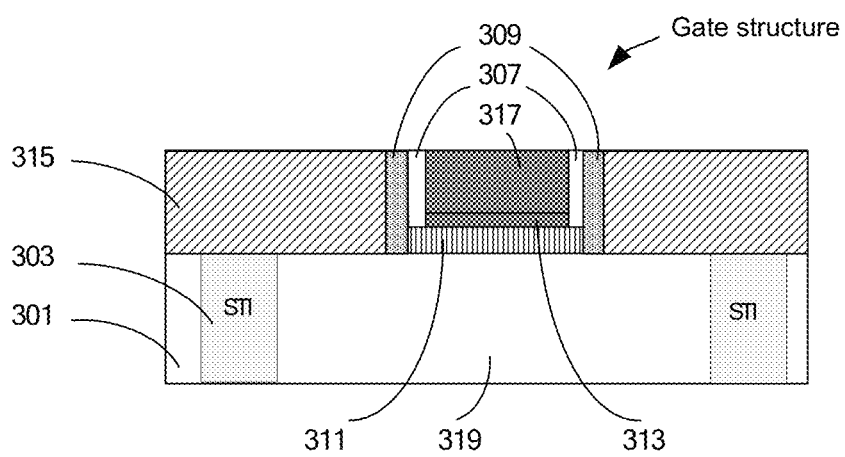
FIG. 3 is a schematic view illustrating a semiconductor device according to an embodiment of the present invention.

A semiconductor device is provided according to an embodiment of the present invention. As shown in FIG. 3, the semiconductor device comprises a substrate 301. The substrate may have an active area 319. In some implementations, active areas can be isolated by trench isolation (STI) 303, however, the present invention is not limited thereto. For example, in some applications, field oxide isolation can be employed as well. Furthermore, a channel region, a source, a drain, a lightly doped diffused or LDD region, and the like, can be formed in the active region, which are not concerns of the present invention and thus are not shown in the drawings and descriptions thereof are omitted.

The semiconductor device further comprises a gate structure on the active region of the substrate 301 and spacers 309 on opposite sides of the gate structure.

The gate structure comprises a gate dielectric layer 311 that is disposed on a surface of the active region. In one embodiment, the gate dielectric layer 311 is formed of a high-K dielectric, for example, hafnium oxide (HfO), and the like. However, the present invention is not limited thereto. The gate structure may further comprise a metal gate 317 located over the gate dielectric layer 311. The metal gate can be formed of a metal, for example, Cu, Al, and the like, or a metal alloy.

In some embodiments, the semiconductor device may further comprise a conductive buffer layer 313 that is interposed between the gate dielectric layer and the metal gate, and the conductive buffer layer may have edges that are vertically aligned with the side walls of the metal gate, as shown in FIG. 3. The conductive buffer layer may be interposed between sidewalls which will be described below.

The gate structure further comprises standing sidewalls 307 that are disposed alongside the side surfaces of the metal gate and the edges of the conductive buffer layer. In other words, each of the sidewalls 307 is disposed on the gate dielectric layer 311 and interposed between the metal gate 317 and one of the spacers 309. In one embodiment, the sidewalls are formed of a self-assembly material (SAM).

In one embodiment, the self-assembly material may comprise CH$_3$(CH$_2$)$_x$CH$_2$SiCl$_3$, where x is an integer. In one embodiment, x is an integer between 6 and 10, and more In one preferred embodiment, x is 8.

In some embodiments of the present invention, the metal gate can be formed without removing the SAM sidewalls, as shown in FIG. 3; while, in other embodiments, the SAM sidewalls can be removed.

The spacers 309 are located at the outside of the sidewalls (i.e., outside with respect to the gate dielectric layer). The spacers 309 contact the gate dielectric layer 311 and corresponding sidewalls 307. In one embodiment, the spacers are formed of silicon nitride (SiN).

The conductive buffer layer 313 can be formed of titanium nitride (TiN) in an embodiment. However, the present invention is not limited thereto; the conductive buffer layer 313 can be formed of, for example, tantalum (Ta), tantalum nitride (TaN), alloy of tantalum nitride and aluminum nitride (TaAlN), or alloy of titanium nitride and aluminum nitride (TiAlN). Those skilled in the art would appreciate that the conductive buffer layer 313 can be used to address hillock phenomenon related to metal material (for example, Cu or Al) to be formed later, enhance adhesion between the metal material and the dielectric material, and so on.

In addition, in some preferable embodiments of the present invention, the semiconductor device may further comprise an interlayer dielectric layer 315. The interlayer dielectric layer 315 is formed on the substrate and the gate structure is formed in the interlayer dielectric layer. In other words, the interlayer dielectric layer 315 is formed at the outside of the spacers with respect to the gate structure, adjoining the spacers. In one embodiment, the upper surface of the interlayer dielectric layer 315 is substantially flush with the upper surface of the metal gate, so as to make the surface of the resultant structure planar for facilitating subsequent processes.

Below, a method of manufacturing a semiconductor device according to an embodiment of the present invention will be described with referent to FIGS. 4 through 11.

Figure 4:
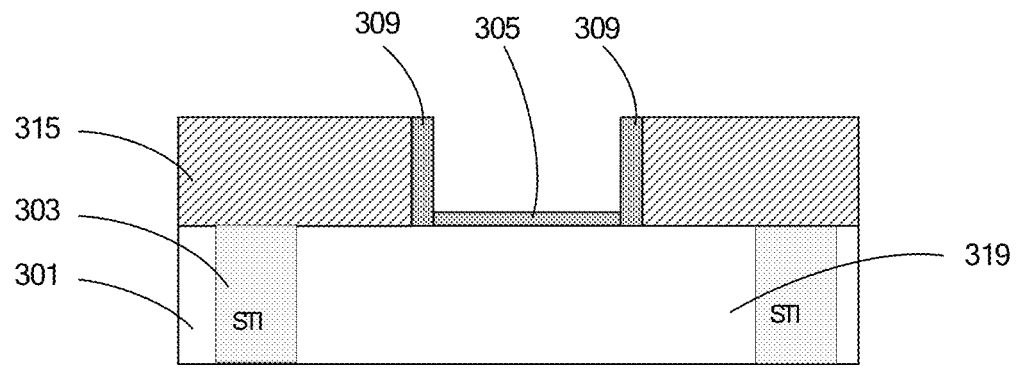
FIGS. 4-11 are schematic views illustrating a method of manufacturing a semiconductor device according to an embodiment of the present invention.

As shown in FIG. 4, a substrate 301 is provided. The substrate has an active region 319. The substrate 301 is formed with an interlayer dielectric layer 315 thereon. In the interlayer dielectric layer 315, an opening is formed to expose a portion of the surface of the active region. The side surfaces of the opening can be formed with spacers 309 located thereon, and a first dielectric layer 305 is formed on the surface of the active region between the spacers.

According to a specific embodiment, the substrate as described above can be formed through a gate-last manufacturing technique in the present invention. According to the embodiment, a first dielectric layer 305 and a dummy gate (not shown) are formed on the active region of the substrate 301. The first dielectric layer can be formed of silicon oxide. In an example embodiment, silicon oxide can be formed through thermal oxidation, and the dummy gate can be formed of polysilicon; however, it should be understood that the invention is not limited thereto. Herein, LDD region implantation or extension region implantation can be carried out to form a LDD region or an extension region. Then, spacers 309 are formed on side surfaces of the dummy gate and the first dielectric layer. In one embodiment, the spacers 309 are formed of silicon nitride. In one embodiment, source and drain implantation can be herein carried out through a self-aligned process. Then, a first interlayer dielectric layer 315 is deposited on the substrate. The first interlayer dielectric layer may include silicon oxide through a CVD or PECVD process, a CMP operation can then be performed on the first interlayer dielectric layer until a top portion of the dummy gate is exposed. Thus, the dummy gate is removed to form a substrate structure as shown in FIG. 4. It should be understood that gate-last manufacturing techniques are well known in the art. Also, the present invention is not limited to forming the structure shown in FIG. 4 with the use of a gate-last technique. In addition, it should be understood that the materials for the various layers or components described above are merely exemplary or are typical materials, and the present invention is not limited thereto.

Figure 5:
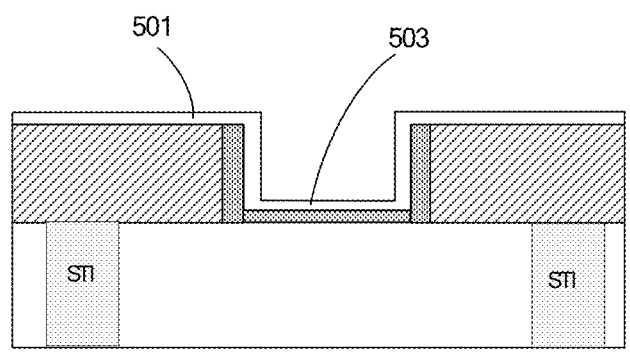
Figure 6:
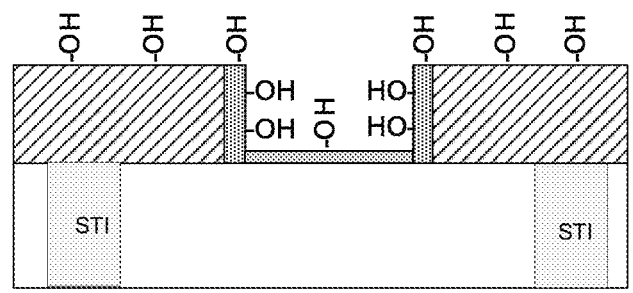

Then, a self-assembly material (SAM) layer 501 is formed to cover at least the surface of the spacers 309 and the surface the first dielectric layer 305, as shown in FIG. 5.

In one embodiment of the present invention, a self-assembly material having the chemical formula of $CH_3(CH_2)_xCH_2SiCl_3$ can be used, where x is an integer. Here, x can be adjusted to optimize conditions for removing the underlying first interlayer dielectric layer 305 while enabling the self-assembly material to be remained on the spacers. In one embodiment, x is an integer in a range from 6 to 10. In a preferred embodiment, x is 8.

The substrate structure having the first dielectric layer 305, the spacers 309 and the interlayer dielectric 315 formed thereon as described above (it can be referred to as an intermediate structure) can be disposed in a n-decyl trichlorosilance/ethanol solution for 30 minutes to 24 hours, so as to form the self-assembly material layer 501. It should be understood that the method of forming the self-assembly material layer 501 is not limited thereto. For example, a coating of the above solution can be formed on the substrate described above (the intermediate structure) through spin coating, dipping or droplet discharging.

In one embodiment, the portion 503 of the self-assembly material layer formed on the first dielectric layer 305 can be relatively thin, for example, the portion 503 can be a monolayer of the self-assembly material, while portions of the self-assembly material layer formed on the surface of the spacers can be thicker.

Herein, in one embodiment, before forming the self-assembly material layer 501, a pre-treatment is preformed on the substrate structure (the intermediate structure) thus formed, that is, a pre-treatment is preformed on the surface of the interlayer dielectric, on the surface of the spacers and on the surface of the first dielectric to form dangling bonds on these surfaces. According to a specific embodiment of the present invention, the pre-treatment can be preformed with the use of a sulfuric acid/hydrogen peroxide ($H2SO_4/H_2O_2$) solution or a SC-2 solution (i.e., hydrochloric acid/hydrogen peroxide/water ($HCl/H_2O_2/H_2O$)). With the pre-treatment, those treated surfaces, in particularly, the surface of the spacers, can be formed with hydroxyl, that is, —OH termination, as illustratively shown in FIG. 6.

The self-assembly material layer 501 can be formed after the pre-treatment, so that the portion of the self-assembly material layer formed on the first dielectric layer 305 can be relatively thin. In an example embodiment, the portion of the self-assembly material layer formed on the first dielectric layer 305 can be a mono-layer, while the portions of the self-assembly material layer formed on the surface of the spacers can be thicker.

Figure 7:
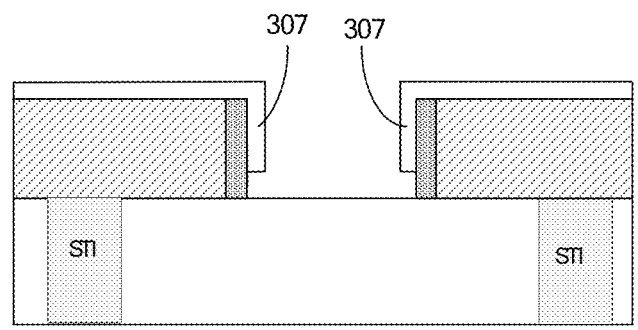

In an embodiment, annealing can be carried out after forming the self-assembly material layer 501, for example, at a temperature of 110° C. for 1 min. Then, the portion 503 of the self-assembly material layer 501 formed over the first dielectric layer 305 is removed and the first dielectric layer 305 is removed. Thereby, a portion of the surface of the active region is exposed, and standing sidewalls 307 are formed of the self-assembly material as shown in FIG. 7. It should be appreciated that the sidewalls 307 are not necessarily standing upright, rather, they can be somewhat tilted (sloped). Herein, the portion 503 of the self-assembly material layer 501 formed on the first dielectric layer 305 as well as the first dielectric layer 305 can be removed with the use of diluted hydrofluoric acid (DHF), for example, an aqueous solution containing 1 percent by weight of hydrofluoric acid.

Here, because a thin layer (for example, mono-layer) of self-assembly material is formed on the first dielectric layer 305, which has weak points, therefore, DHF can be introduced to the underlying first dielectric layer, and thus the mono-layer and the first dielectric layer can be removed by the DHF. It should be understood that solutions and methods for the removing are not limited to the use of DHF, and various solutions and methods can be selected depending upon the materials of the sidewalls and the first dielectric layer, as long as the sidewalls 307 formed of the self-assembly materials can be remained.

Besides, although the self-assembly layer is shown to be remained on the surface of the interlayer dielectric layer as shown in FIG. 7, it should be understood that whether it is remained on the surface of the interlayer dielectric layer is not a concern of the present invention.

Figure 8:
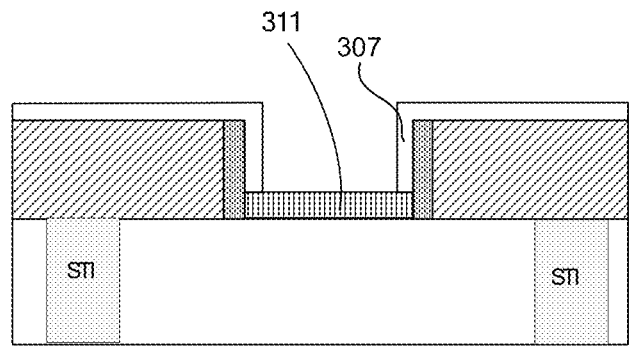
Figure 9:
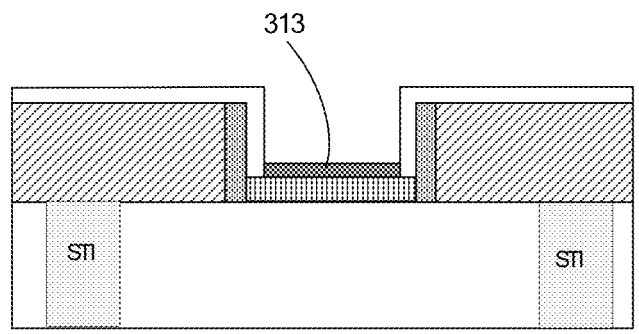
Figure 10:
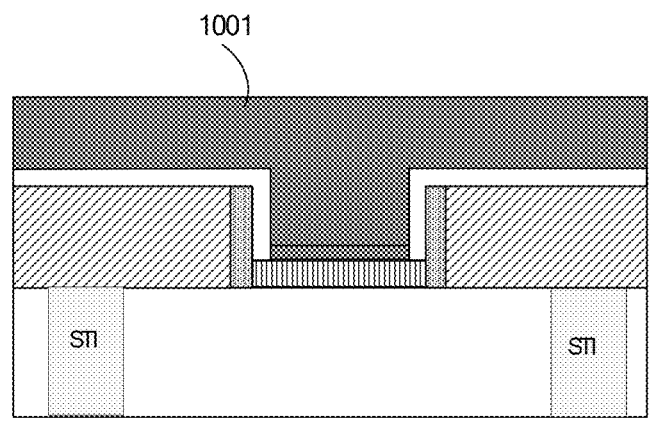
Figure 11:
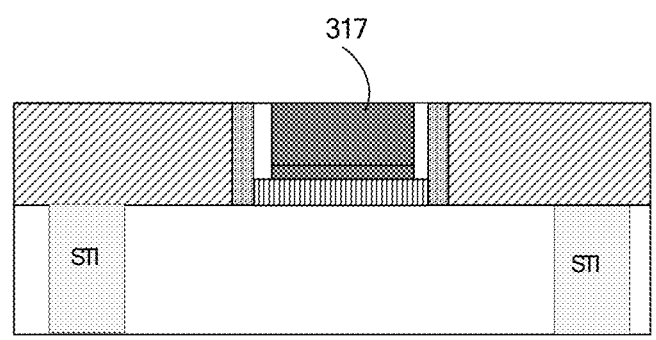

Thereafter, as shown in FIG. 8, a second dielectric layer 311 is selectively formed on the exposed surface of the active region.

In one embodiment, the second dielectric layer 311 is formed of a high-K dielectric material, for example, an oxide of a rare earth element, and more particularly, the second dielectric layer 311 can be formed of hafnium oxide (HfO) or other materials. However, the present invention is not limited thereto. The second dielectric layer 311 can be used as a gate dielectric layer.

Herein, a high-K dielectric layer 311 can be formed through, for example, atomic layer deposition (ALD). The high-K dielectric material can be prepared with the use of a chlorine-contained precursor and an oxygen-contained precursor. For example, in a preferable embodiment of the present invention, with hafnium chloride ($HfCl_4$) and water vapor as precursors, a HfO layer is selectively formed on the exposed surface of the active region and not formed on the surface of the self-assembly material layer through atomic layer deposition (ALD) or plasma enhanced ALD. In another preferable embodiment of the present invention, a HfO layer is selectively formed on the exposed surface of the active region with the use of $Hf(Obu)_4$ and $O_2$ precursors. $Hf(Obu)_4$ is a common term in the related art, which can be representatively denoted as $Hf(OC_4H_9)_4$.

In addition, although the second dielectric layer 311 is shown to have an upper surface abutted to the low end (or lower surface) of the sidewalls 307 in FIG. 8, it should be understood that it is merely illustrative and the present invention is not limited thereto.

Thus, according to the present invention, the dielectric constant of the sidewall can be reduced, or even, the sidewall formed of high-K material can be removed or eliminated.

Thereafter, a conductive buffer layer 313 is selectively formed over the second dielectric layer by using the self-assembly material layer as a mask. The conductive buffer layer 313 can be formed of TiN, for example; however, the present invention is not limited thereto. According to a specific embodiment of the present invention, the conductive buffer layer 313 can be selectively formed on the second dielectric layer through plasma enhanced atomic layer deposition. In an exemplary embodiment, the conductive buffer layer 313 can be selectively formed on the second dielectric layer through plasma enhanced atomic layer deposition with the use of a titanium-contained precursor (for example, $TiCl_4$ with a flow rate of 300 sccm, and Ar with a flow rate of 1 slm) which is plasma cracked and a nitrogen-contained precursor (for example, $NH_3$ with a flow rate of 500 sccm, and Ar with a flow rate of 1 slm) which is plasma cracked, at a plasma power of 300 W, a pressure of 0.05 Torr-0.15 Torr, and a temperature from room temperature (RT) to about 150° C. Herein, in one embodiment, the titanium-contained precursor is introduced into the processing chamber first.

Then, a metal material layer 1001 is formed on the substrate through, for example, deposition or sputtering, to at least fill in the opening whose bottom is the conductive buffer layer. Thereafter, the metal material layer 1001 is chemically and mechanically polished (CMP), until the surface of the interlayer insulating layer is exposed, so that the upper surface of the metal gate 317 is substantially flush (coplanar) with the surface of the top portions of the interlayer dielectric layer 315, so as to facilitate subsequent processes. Thereby, a metal gate 317 is formed over the conductive buffer layer.

According to another embodiment of the present invention, the self-assembly material layer 501 can be removed after forming the gate insulating layer 311. Thereafter, a buffer layer can be formed over the substrate according to conventional processes to cover the surface of the gate dielectric layer 311, the surface of the spacers 309 and the upper surface of the interlayer dielectric layer 315, then a metal gate material layer is formed on the buffer layer. The metal gate material layer then can be chemically and mechanically polished (CMP) so that the upper surface of the metal gate 317 is substantially flush with the upper surface of the interlayer dielectric layer 315.

According to the present invention, one or more problems in the prior art can be alleviated or addressed. Furthermore, the K value (i.e., dielectric constant) of the dielectric at the sidewalls in the semiconductor device can be lowered, even the sidewall formed of high-K dielectric material can be eliminated, and consequently the parasitic capacitance can be reduced. Furthermore, the metal film coverage in a semiconductor device employing a high-K dielectric material and its manufacturing process (particularly, gate-last process) can be improved according to the present invention.

The embodiments of the present invention have been described as above with reference to the drawings. It should be appreciated that, however, these embodiments are merely illustrative in nature but not intended to limit the scopes of the invention. These embodiments can be arbitrarily combined without going beyond the scope of the present invention. In addition, the embodiments and details of the present invention can be modified by those skilled in the art in light of the teachings of the invention, without departing from the scope of the present invention. Therefore, all these modifications are embraced within the spirit and scope of the present invention as defined by the appended claims.

What is claimed is:

1. A method of manufacturing a semiconductor device, comprising:
   (a) providing a substrate having an active region, an interlayer dielectric layer overlying the substrate and having an opening exposing a portion of the active region, spacers on side surfaces of the opening and a first dielectric layer formed on the exposed active region between the spacers;
   (b) forming a self-assembly material layer on surfaces of the spacers and a surface of the first dielectric layer, a portion of the self-assembly material layer on the surface of the first dielectric layer being thinner than portions of the self-assembly material layer on the surfaces of the spacers;
   (c) removing the portion of the self-assembly material layer on the surface of the first dielectric layer while maintaining the portions of the self-assembly material layer on the surfaces of the spacers, and removing the first dielectric layer to expose a surface of the active region; and
   (d) selectively forming a second dielectric layer on the exposed surface of the active region.

2. The method according to claim 1, further comprising:
   (e) before forming the self-assembly material layer, pretreating a surface of the interlayer dielectric, the surface of the spacers, and a surface of the first dielectric layer to form dangling bonds on those surfaces.

3. The method according to claim 2, wherein the pretreating is conducted using a $H_2SO_4/H_2O_2$ or SC-2 solution so that the surfaces are formed with —OH termination.

4. The method according to claim 1, wherein the portion of the self-assembly material layer is a mono-layer of the self-assembly material.

5. The method according to claim 1, wherein the portion of the self-assembly material and the first dielectric layer are removed using diluted hydrofluoric acid.

6. The method according to claim 1, wherein the second dielectric layer comprises a high-K dielectric material.

7. The method according to claim 6, wherein the high-K dielectric material is hafnium oxide.

8. The method according to claim 7, wherein the hafnium oxide is prepared using $HfCl_4$ and water vapor as precursors.

9. The method according to claim 7, wherein the hafnium oxide is prepared using $Hf(Obu)_4$ and $O_2$ as precursors.

10. The method according to claim 1, wherein the self-assembly material is $CH_3(CH_2)_xCH_2SiCl_3$, where x is an integer in a range from 6 to 10.

11. The method according to claim 10, wherein x is 8.

12. The method according to claim 1, further comprising:
(f) selectively forming a conductive buffer layer on the second dielectric layer using the self-assembly material layer as a mask.

13. The method according to claim 12, wherein the buffer layer comprises one of titanium nitride (TiN), tantalum (Ta), tantalum nitride (TaN), alloy of tantalum nitride and aluminum nitride (TaAlN), or alloy of titanium nitride and aluminum nitride (TiAlN).

14. The method according to claim 12, wherein the conductive buffer layer is formed through Enhanced Atomic Layer Deposition using a titanium-contained precursor and a nitrogen-contained precursor which are plasma-cracked, and during the formation of the buffer layer, the titanium-contained precursor is introduced first.

15. The method according to claim 12, further comprising:
(g) forming a metal gate on the buffer layer.

16. The method according to claim 14, wherein the inter-layer dielectric layer comprises an upper surface that is substantially flush with an upper surface of the metal gate.

17. The method according to claim 1, further comprising:
(h) annealing after forming the self-assembly material layer.

* * * * *